US012040418B2

(12) United States Patent
Shulga et al.

(10) Patent No.: US 12,040,418 B2
(45) Date of Patent: Jul. 16, 2024

(54) IMAGING DEVICE BASED ON COLLOIDAL QUANTUM DOTS

(71) Applicant: Rijksuniversiteit Groningen, Groningen (NL)

(72) Inventors: Artem Gennadiiovych Shulga, Groningen (NL); Maria Antonietta Loi, Groningen (NL)

(73) Assignee: Rijksuniversiteit Groningen, Groningen (NL)

( * ) Notice: Subject to any disclaimer, the term of this patent is extended or adjusted under 35 U.S.C. 154(b) by 618 days.

(21) Appl. No.: 17/186,181

(22) PCT Filed: Aug. 26, 2019

(86) PCT No.: PCT/NL2019/050544
§ 371 (c)(1),
(2) Date: Feb. 26, 2021

(87) PCT Pub. No.: WO2020/046117
PCT Pub. Date: Mar. 5, 2020

(65) Prior Publication Data
US 2021/0359147 A1    Nov. 18, 2021

(30) Foreign Application Priority Data
Aug. 27, 2018  (EP) .................................. 18190979

(51) Int. Cl.
*H01L 31/0352*  (2006.01)
*H01L 27/146*  (2006.01)
(Continued)

(52) U.S. Cl.
CPC .............. *H01L 31/035218* (2013.01); *H01L 27/14614* (2013.01); *H01L 27/14683* (2013.01); *H04N 25/75* (2023.01); *H04N 25/79* (2023.01)

(58) Field of Classification Search
CPC ....... H01L 31/035218; H01L 27/14614; H01L 27/14683; H01L 31/101; H01L 27/14601; H04N 25/75; H04N 25/79
See application file for complete search history.

(56) References Cited

U.S. PATENT DOCUMENTS

| 2007/0132052 A1 | 6/2007 | Sargent et al. |
| 2012/0223291 A1 | 9/2012 | Klem et al. |

(Continued)

FOREIGN PATENT DOCUMENTS

| CN | 101803055 A | 8/2010 |
| CN | 102017147 A | 4/2011 |

(Continued)

OTHER PUBLICATIONS

International Search Report and Written Opinion—PCT/NL2091/050544—mailing date Jan. 14, 2020.
Jun. 5, 2023—Chinese Office Action—CN App. No. 201980066322.7.

*Primary Examiner* — Nhan T Tran
(74) *Attorney, Agent, or Firm* — Banner & Witcoff, Ltd.

(57) ABSTRACT

An imaging device (100) comprises a stack of photoactive layers (11) including at least a p-type photoactive layer (11p) and an n-type photoactive layer (11n). The photoactive layers comprise quantum dots (QD) formed by semiconductor nanocrystals capped by ligands. Readout electronics comprise electrodes (13t, 13b) sandwiching the photoactive layers (11). At least one of the electrodes (13b) is divided in respective pixels (10p) for collecting photo-generated charges from respective parts of the photoactive layers. Each pixel (10p) comprises an amplification circuit to amplify the photo-generated charge, preferably using a DG-FET. An intermediate layer (11i) can be provided between the p- and n-type photoactive layers (11p, 11n).

20 Claims, 10 Drawing Sheets

(51) Int. Cl.
*H04N 25/75* (2023.01)
*H04N 25/79* (2023.01)

(56) References Cited

U.S. PATENT DOCUMENTS

| | | |
|---|---|---|
| 2016/0049536 A1 | 2/2016 | Kim et al. |
| 2016/0172513 A1 | 6/2016 | Williams et al. |
| 2017/0018669 A1* | 1/2017 | Williams .......... H01L 27/14601 |
| 2018/0203134 A1* | 7/2018 | Chappo ............... G01T 1/20185 |
| 2019/0360041 A1* | 11/2019 | Wu ........................ B82Y 30/00 |

FOREIGN PATENT DOCUMENTS

| | | |
|---|---|---|
| WO | 2008131313 A2 | 10/2008 |
| WO | 2009012324 A1 | 1/2009 |
| WO | 2009143357 A2 | 11/2009 |

\* cited by examiner

IMAGING DEVICE BASED ON COLLOIDAL QUANTUM DOTS

CROSS-REFERENCE TO RELATED APPLICATIONS

This application is a U.S. National Stage application under 35 U.S.C. § 371 of International Application PCT/NL2019/050544 (published as WO 2020/046117 A1), filed Aug. 26, 2019, which claims the benefit of priority to Application EP 18190979.7, filed Aug. 27, 2018. Benefit of the filing date of these prior applications is hereby claimed. Each of these prior applications is hereby incorporated by reference in its entirety.

TECHNICAL FIELD AND BACKGROUND

Aspects of the present disclosure relate to an imaging device with photoactive layers comprising colloidal quantum dots (CQDs). Further aspects may relate to structure and fabrication methods for photodetectors and imaging sensors using CQDs and/or other thin film materials.

Colloidal quantum dots typically comprise nanocrystals of inorganic material that have discrete energy levels due to quantum confinement of electrons within the volume of the nanoparticles. CQDs, synthesized from different materials, have size-dependent band gap that can be optimized for light absorption in the selected range of wavelengths. The material choice may be important for the size of the band gap, and for charge transport and absorption properties of the material. Advantages of CQDs may include high light absorption coefficient, high charge-carrier mobilities, solution-processability and low price. CQD films, casted on top of a virtually any substrate, can be further processed using photolithography methods. These properties may allow fabrication of fast, highly-sensitive, low noise photodiodes for photodetection and/or imaging.

As synthesized, CQDs are generally capped with long aliphatic ligands (such as oleic acid (OA)), ensuring homogeneous growth of the nanoparticles and the colloidal stability of the solution. These ligands effectively passivate the surface of the CQDs, which may result in low defect density and, therefore, low density of trap states within the band gap of the CQDs. In some cases, the OA ligand shell may represent a dielectric barrier, separating electronically quantum dots from each other in solution or in film, depressing the charge transfer between quantum dots. This enables very high photoluminescence quantum yields of OA-capped CQDs, since excitons, formed within CQDs, cannot be separated into free charges and they eventually recombine radiatively within the quantum dot, where the exciton was formed. For example, the optical properties of OA-capped CQDs film may resemble a group of individual CQDs, without electronical interaction between individual nanoparticles. For photo-detection it is desired to separate efficiently the photo-generated charges and transfer them to the contacts in order to get photo-response signal.

In the prior art, binary or tertiary blends of CQDs with organic materials was used, with CQDs being light absorbers, and other components being transporting materials for electrons and holes [doi.org/10.1002/adma.200801752 or US 2011/0095266 A1]. However, these systems may suffer from slow operation speed due to low mobility and long pathways for the carriers and relatively low quantum efficiency.

Another approach is using CQDs film, where the nanoparticles are electronically coupled and efficient charge transport between nanoparticles is possible. In order to allow charge transport through the CQDs film, ligand exchange can be implemented. Bulk OA ligands can be exchanged on the surface of quantum dots by other entities, that are smaller in size and do not block carriers transport between CQDs. Ligand exchange can be made in solution (resulting in CQDs inks) or in film. The charge transport in ligand-exchanged CQDs film can be described by hopping theories, such as variable-range Mott hopping or nearest neighbor hopping. It means that the charges can hop within the film between individual nanoparticles using phonon-assisted tunneling. Therefore, at the room temperature, the photo-generated excitons are efficiently separated into free carriers that can be extracted using built-in or applied electric field.

In the previous art, CQDs were first used as p-type semiconductor. A photodetector was made from such a film in p-n heterojunction configuration, where p-type CQDs film was a photosensitive component used in combination with either fullerene derivative [US 2012/0223291 A1] or transparent n-type metal oxide [doi.org/10.1002/adfm.201102532].

Tang et al [dx.doi.org/10.1021/nl302436r|Nano Lett. 2012, 12, 4889-4894] describes Quantum Junction (QJ) Solar Cells. As described, colloidal quantum dot (CQD) solids combine solution-processing with quantum size effect tuning, offering avenues to multi-junction cells based on a single materials synthesis and processing platform. In the quantum junction described, the p- and n-type layers are constructed from the same underlying material, ensuring band alignment for CQDs of any size. To build the QJ device, the n-side of the junction is formed by employing a PbS layer treated with a halide salt in an inert environment to yield n-type films. Tetramethylammonium hydroxide in ambient, combined with air annealing, is used to maximize oxygen binding and thus p-doping.

US 2017/0018669 A1 describes a composite quantum-dot photodetector comprising a substrate with a colloidally deposited thin film structure forming a photosensitive region, the thin film containing at least one type of a nanocrystal quantum-dot, whereby the nanocrystal quantum dots are spaced by ligands to form a (regular) lattice, and the lattice of the quantum dots has an infill material that forms an inorganic matrix that isolates the nanocrystal quantum dots from atmospheric exposure. The known film is built up using layer-by layer method, where a monolayer of quantum dots is deposited, the original ligands are exchanged, and further inorganic matrix is formed within a reactor. As a result, an ordered monolayer of quantum dots in inorganic matrix is formed and the process is repeated to achieve necessary thickness. The material of the matrix can in principle provide n- or p-type doping of quantum dots, which however may lose photosensitivity due to high concentration of free charges and fast recombination of photo-generated charges. Thus the charge separation can typically take place only in a depleted region at the interface between n and p parts.

There is yet a need for further improvements in operation and manufacturing of imaging devices for various applications

SUMMARY

Aspects of the present disclosure relate to an imaging device and method of manufacturing. Typically, the imaging device comprises a stack of photoactive layers. As described herein, the photoactive layers comprise quantum dots formed by semiconductor nanocrystals capped by ligands.

For example, these are manufactured by depositing a solution with colloidal quantum dots (CQD). Preferably, the stack of photoactive layers includes at least a p-type photoactive layer and an n-type photoactive layer to form a junction. For example, the different types of layers are determined by ligand exchange and/or properties of the semiconductor materials used. By including n- and p-type CQD layers, an electric field may be established across the junction which can help charge separation. Most preferably, the stack of photoactive layers comprises at least three different types of photoactive layers including an intermediate photoactive layer between the p- and n-type photoactive layers. For example, the intermediate layer may be i-type where the Fermi level lies in the middle of the electronic band gap of the layer. As will be appreciated, the present methods and system do not need to any inorganic matrix filling or barrier layers. As described herein n- and p-type quantum dot layers preferably have no induced free charges. Preferably, the respective shift of the Fermi level provides an electric field within the whole p-n or p-i-n quantum dot film. Advantageously, the device as described herein, can use p, i, or n-type layers which are deposited at once (in a single processing step), e.g. using inks, where original ligands were exchanged in solution. This may be contrasted e.g. to methods which use time-consuming layer-by-layer deposition of quantum dots and inorganic matrix. The photoactive layers resulting from the present methods may also be structurally different. For example, using layer-by layer deposition with monolayers may result in a regular lattice, e.g. repeated three-dimensional arrangement of particles, while a method wherein each photoactive layer (with all of its many particle layers) is deposited at once by applying a respective solution comprising colloidal quantum dots (CQD), may provide photoactive layers in which the quantum dots are disordered as in amorphous material. Advantageously, the shift of the fermi level can be due to an appropriate choice of the ligands instead of the inorganic matrix. For example, the charge transport mechanism can be hopping through energy level as in an amorphous disordered system. Using various combinations of quantum dot and other layers, e.g. visible, (near) infrared, and even X-ray imaging devices can be built. Typically, the imaging device comprises pixels with corresponding readout electronics. For example, the readout electronics may include electrodes sandwiching the photoactive layers. Preferably, at least one of the electrodes is divided in respective pixels for collecting and/or distinguishing photo-generated charges from respective parts of the photoactive layers. Most preferably, each pixel comprises an amplification circuit to amplify the photo-generated charge. Examples of preferred circuits are described herein, e.g. comprising a double gated field effect transistor (DG-FET), most preferably coupled to a second FET.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

Aspects of the present disclosure may provide imaging devices for high frequency, low noise light detection in various wavelength ranges, e.g. from mid-infrared and visible to UV, X-ray and gamma photons. The photosensitive part of the apparatus preferably comprises CQDs-based photodiodes. The CQDs films are preferably composed of CQDs, capped with ligands that allow electronic communication and charge transport between quantum dots. The degree of the inter dot coupling is preferably sufficient to ensure effective exciton dissociation process in the CQDs film via phonon-assisted tunneling at room temperature. Proposed photodiodes contain e.g. p-n or p-i-n junction for efficient charge extraction, fabricated by using layered CQDs film with n-, p- or ambipolar properties of the layers. The p-n or p-i-n junction architecture may provide built-in electric field, enhancing photocurrent generation and efficiently blocking the dark current under reverse bias. The photodiode may contain additional layers, such as electron transport layer (TiO2 or ZnO films or nanoparticles or other), hole transport layer (NiO, MoOx, V2O5, PbI, organic materials and others) or other layers needed for successful charge transport or blocking. As will demonstrated the photodiodes show very fast rise time and high quantum efficiency. Photodiodes, as described herein, are particularly suitable for imaging application due to possibility of fabrication of large area CQDs films from solution and subsequent patterning e.g. using photolithography.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1A:
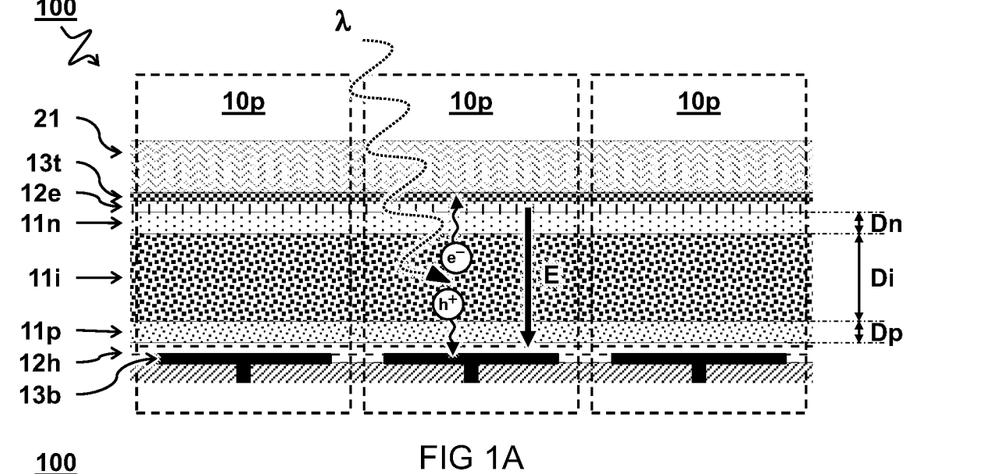
FIGS. 1A-1C illustrate cross-section views of imaging devices according to some embodiments.
Figure 1B:
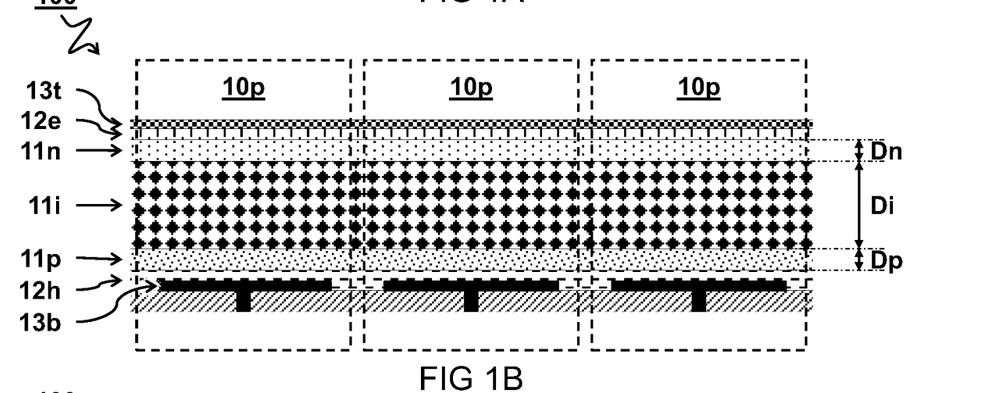
Figure 1C:
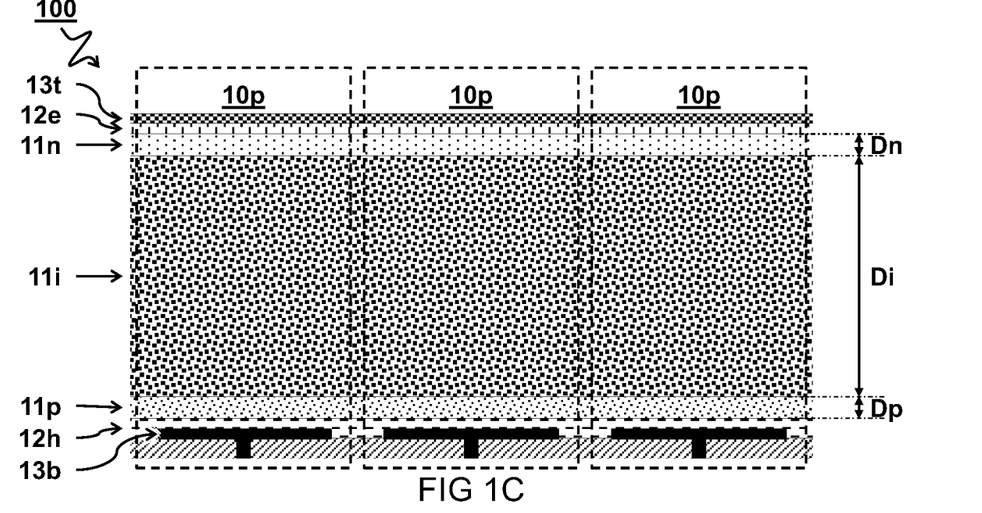

FIGS. 1A-1C illustrate cross-section views of imaging devices 100 according to some embodiments.

In one embodiment, an imaging device 100 comprises a stack of photoactive layers 11 including at least a p-type photoactive layer 11p and an n-type photoactive layer 11n. The term n-type refers the negative charge of the electron "e−", and means that electrons are the majority carriers in the semi-conductive layer while holes are the minority carriers. Conversely, the term p-type refers the positive charge of the hole "h+", and means that holes are the majority carriers in the semi-conductive layer while electrons are the minority carriers. As shown in FIG. 1A, light with wavelength λ may create an exciton electron hole pair where the charges may be separated to flow to the different electrodes 13t, 13b.

Typically, n-type or p-type semiconductors are created by doping an intrinsic semiconductor with donor impurities. In a preferred embodiment, one or more, preferably all, of the photoactive layers comprise quantum dots (QD) formed by semiconductor nanocrystals capped by ligands. As described herein, ligands capping the semiconductor crystals may determine the type of quantum dot film. Without being bound by theory, a selection of appropriate entities as ligand, may influence the position of a Fermi level in the quantum dot film. For example, I— ligands may shift the Fermi level close to LUMO level of QDs, making it effectively n-type film, and OH— ligands may move the Fermi level closer to HOMO level, making the film p-type. For example, the effects of these ligands are illustrated later with reference to FIG. 6.

When different type films are casted on top of each other, a p-n quantum junction can be created. This may reduce the dark current and enhances the charge separation process. Additionally, using e.g. SCN-ligands, i-type or ambipolar CQDs film can be made, where the Fermi level lies in the middle of the band gap. Advantageously the i-type can be sandwiched between p- and n-type QD films to create p-i-n photodiodes. The charge carrier mobilities of such films may be the order of 0.001 to 1 $cm^2V^{-1} s^{-1}$, allowing relatively fast charge transport and extraction from the photodiodes.

In some embodiments, the photoactive layers are amorphous, e.g. comprising a disordered structure of quantum dots. For example, such layers may result when a respective photoactive layer is deposited by applying a respective solution comprising colloidal quantum dots (CQD). Preferably, each type of photoactive layer is deposited in a single (fluid) processing step, e.g. as opposed to a (mono) layer-by-layer deposition. In other or further embodiments, the quantum dots are essentially separated by the ligands, e.g. without inorganic matrix there between. Alternatively, it can be envisaged to use a matrix, e.g. inorganic or otherwise. In one embodiment, the semiconductor nanocrystals are capped by respective types of ligands. In a preferred embodiment, the respective type of the photoactive layer is exclusively or essentially determined by a respective type of the ligands. In one embodiment, the photoactive layers comprise the same semiconductor nanocrystals. For example, the layers exclusively differ by the type of ligands. In another or further embodiment, the respective type of the photoactive layer is predominantly or at least partially determined by a respective type of the ligands. In some embodiments, the type of the photoactive layer is at least partially determined by inorganic dopants added to the layer. In other or further embodiments, the type of the photoactive layer is exclusively, essentially, or predominantly determined by inorganic dopants added to the layer. In one embodiment, the layers exclusively differ by the type of inorganic dopants. Alternatively, or additionally, it can be envisaged to use organic molecules/polymers instead of an inorganic matrix.

In one embodiment, the imaging device 100 comprises readout electronics. For example, the readout electronics comprise electrodes 13t, 13b sandwiching the photoactive layers 11 (with possibly other layers there between). Typically, at least one of the electrodes 13b is divided in respective pixels 10p for collecting photo-generated charges from respective parts of the photoactive layers. In a preferred embodiment, each pixel 10p comprises an amplification circuit to amplify the photo-generated charge which will be described in further detail below.

In a preferred embodiment, as shown, the stack of photoactive layers 11 comprises at least three different types of photoactive layers including an intermediate photoactive layer 11i between the p-type photoactive layer 11p and the n-type photoactive layer 11n. In a preferred embodiment, the intermediate photoactive layer 11i is formed by an i-type quantum dot layer. In other embodiments, the intermediate layer may also be an n- or p-type layer, though preferably with less density of free electrons or holes compared to the n- or p-type layer.

In some embodiments, the quantum dots in different types of photoactive layers 11p, 11i, 11n are capped with a respective different type of ligand. In a preferred embodiment, the different types of ligands determine the different types of layers. In one embodiment, an n-type photoactive layer 11n is formed by capping the semiconductor nanocrystals with ligands that shift the Fermi level in the quantum dot close to the lowest unoccupied energy level, e.g. halide ligands such as iodide ($I^-$). In another or further embodiment, a p-type photoactive layer 11p is formed by capping the semiconductor nanocrystals with ligands that shift the Fermi level in the quantum dot close to the highest occupied energy level, e.g. hydroxide ($OH^-$). In another or further embodiment, an i-type photoactive layer 11i is formed by capping the semiconductor nanocrystals with ligands exhibiting ambipolar characteristics. For example, thiocyanate ($SCN^-$) may provide nearly balanced, high mobilities for electrons and holes.

Suitable materials for the semiconductor nanocrystals may depend on the application. For instance, PbS and PbSe nanoparticles are well suited for visible and near-to mid-infrared light absorption, CdSe—for visible light, and PbS, PbSe, CdTe—for X— and gamma-ray absorption. In a preferred embodiment, all photoactive layers comprise quantum dots with semiconductor nanocrystals of the same material. Alternatively, two or more of the photoactive layers may comprise quantum dots with different semiconductor material, possibly with the same ligands, or also different ligands.

Optionally, as shown, further layers can be added to the stack. In the embodiment shown, an electron transport layer 12e is provided between one of the electrodes 13t and the n-type photoactive layer 11n. In the embodiment shown, a hole transport layer 12h is provided between the other electrodes 13b and the p-type photoactive layer 11n. Typically, the top electrode 13t is transparent at least to the wavelength A of light to be measured by the detector.

Alternatively, the stack can be reversed, e.g. using a transparent substrate and bottom electrode (not shown).

In some embodiments, as shown e.g. in FIG. 1A, a scintillating layer 21 is provided between the stack of photoactive layers 11 and a front side of the device 100 receiving light. For example, the scintillating layer may be configured to convert lower wavelength (high frequency) light such as X-ray into higher wavelength (low frequency) light such as visible or infrared. Furthermore, the quantum dots may be configured, e.g. having a size and material, to absorb the visible or infrared light converted by the scintillating layer and thus allow detection of the lower wavelength. In this way an X-ray detector may be provided. Of course, the shown scintillating layer 21 may also be omitted in other embodiments to provide e.g. a visible light sensor. For example, in these or other embodiments, the intermediate photoactive layer 11i may comprise relatively small quantum dots. For example, the quantum dots comprise led sulfide (PbS) or other material.

As described herein, relatively small quantum dots may have an average or median diameter of less than four nanometer. This may allow e.g. visible light absorption. Conversely, relatively large quantum dots may have an average or median diameter of more than four and half nanometer. This may allow e.g. infrared light absorption. In some embodiments, it may be preferred that the quantum dots are monodisperse, e.g. >95% of the quantum dots fall within ±10% of the average or median diameter. In other embodiments, it may be desired to cover a range of wavelengths using polydisperse quantum dot sizes.

In some embodiments, as shown e.g. in FIG. 1B, the intermediate photoactive layer 11i comprises relatively large quantum dots compared to quantum dots in the p-type photoactive layer 11p and the n-type photoactive layer 11n. For example, the relatively larger quantum dots in the intermediate photoactive layer 11i may be larger by at least a factor 1.1, 1.2, 1.5, or more. For example, the quantum dots in the intermediate photoactive layer 11i may be >4.5 nm, e.g. comprising or other material. This may provide a relatively small band gap to absorb (near)infrared light. So in this way a near infrared detector may be provided.

In some embodiments, the intermediate photoactive layer 11i exclusively comprises the larger quantum dots. In other embodiments, the relatively large quantum dots can be mixed as an additive with relatively smaller quantum dots in the same intermediate photoactive layer lii.

In some embodiments, the intermediate layer with larger quantum dots is an i-type layer, e.g. lead sulfide (PbS) nanocrystals >4.5 nm capped with thiocyanate (SCN−) ligands. It is noted that QD films made from large nanoparticles, which allow light absorption in mid-infrared region, often show ambipolar charge transport and it can be difficult to shift the Fermi level in the film, without introducing high concentration of the trap states in the band gap. So as described herein, the large nanoparticles layer can be sandwiched between p-type and n-type layers, expanding the light detection range to mid-infrared without dramatic increase of the dark current. Another approach is using CQDs film, where larger nanoparticles are incorporated among smaller ones.

In some embodiments e.g. as shown in each of FIGS. 1A-1C, the intermediate photoactive layer 11i has a layer thickness Di larger than the layer thicknesses Dp, Dn of both the p-type photoactive layer 11p and the n-type photoactive layer 11n, e.g. by at least a factor two, five, ten, hundred, or even thousand. For example, a typical layer thickness Dp and/or Dn of the n- and p-type photoactive layers 11p, 11n is preferably between ten and hundred nanometer, more preferably between twenty and fifty nanometer. For example, in the embodiments of a visible or x-ray sensor according to FIG. 1A, or a (near) infrared sensor according to FIG. 1B, a typical layer thickness Di of the intermediate photoactive layer 11i is preferably between hundred and five hundred nanometer, more preferably between two hundred and three hundred nanometer.

In some embodiments, as shown in FIG. 1C, the intermediate layer thickness can be on the order of micrometers, e.g. between one and thousand micrometer, preferably between ten and hundred micrometer. For example, the quantum dots in a relatively thick intermediate layer may provide a direct conversion radiation sensor where the quantum dots absorb ionizing radiation. Preferably, is such embodiment, the quantum dots comprise relatively heavy atoms with a large band gap, e.g. PbS or other material with diameter less than four nanometer.

Figure 2A:
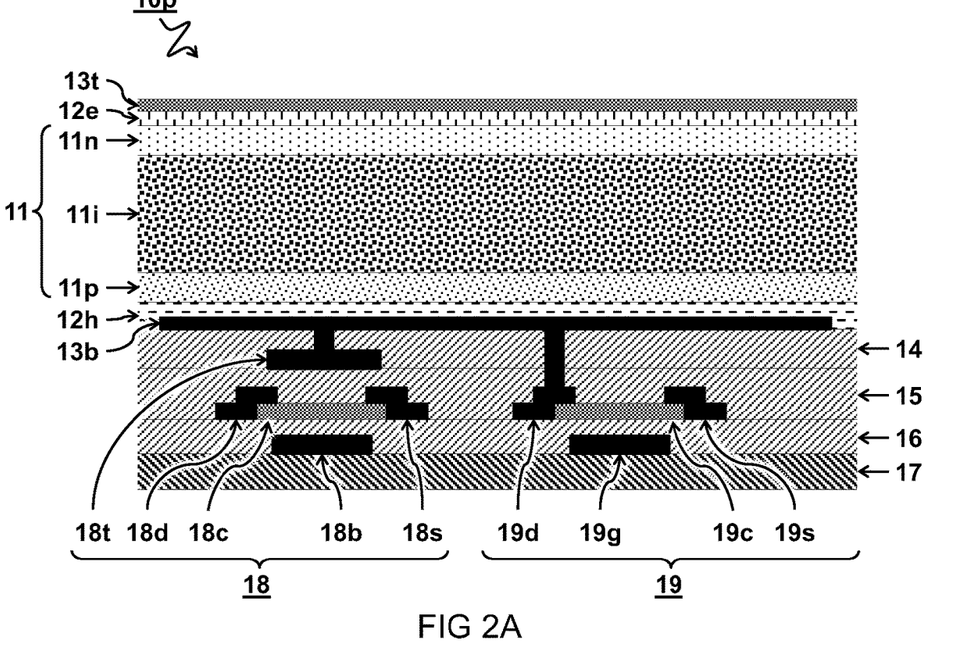
FIGS. 2A and 2B illustrate a cross-section view and corresponding circuit diagram of a pixel according to a preferred embodiment.
Figure 2B:
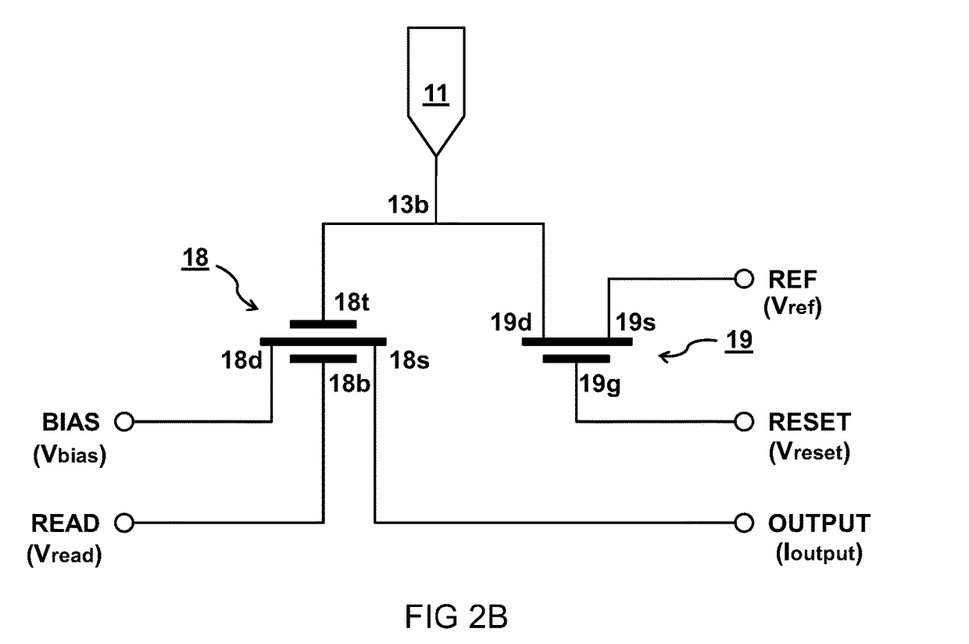

FIGS. 2A and 2B illustrate a cross-section view and corresponding circuit diagram of a pixel 10p.

CMOS-like active pixel sensors are typically pixelated photodetectors for imaging, containing a photosensitive element and field-effect transistors (FETs) for charge amplification, read out and resetting the photodiode in each pixel. One architecture (not shown) contains 3 FETs, when the photodiode is connected to the gate of one of the FETs. Here various improvements are discussed to the parameters of the sensor by choosing different pixel architectures and design. In particular a new pixel architecture is proposed for CMOS-like CQDs-based imaging sensors, based on double gate (DG) field-effect transistor (FET) as a pixel amplifier. In some embodiments, DG FET is used as a 'read' switch and an amplifier of the photogenerated charge.

In a preferred embodiment, each pixel 10p comprises a double gate field effect transistor, DG-FET 18. For example, as shown, the DG-FET 18 has a DG-FET source 18s and a DG-FET drain 18d with a DG-FET channel 18c comprising a semiconductor material there between. In some embodiments, as shown, a first DG-FET gate 18t is adjacent one side of the DG-FET channel 18c and conductively connected to one of the electrodes 13b of the pixel 10p. In some embodiments, as shown, a second DG-FET gate 18b is adjacent another side of the DG-FET channel 18c for applying a read voltage "Vread" to the pixel 10p. For example, the semiconductor material may selectively conduct a current between the DG-FET source 18s and DG-FET drain 18d depending on an electric field applied to the DG-FET channel 18c by a combination of the first and second DG-FET gates 18t, 18b. In a preferred embodiment, as shown, the first DG-FET gate 18t is the top gate of the DG-FET 18, allowing it to be easily connected e.g. to one of the electrodes, preferably the bottom electrode 13b, as shown.

Typically, the DG-FET 18 is configured to have the first DG-FET gate 18t accumulate charges during an integration cycle of the pixel generated by photo-electric conversion in the stack of photoactive layers 11 adjacent the conductively connected electrode 13b. The accumulated charges may create a shift of a threshold voltage of the DG FET, and change an output current "Ioutput" through the DG-FET channel 18c between when the DG-FET source 18s and the DG-FET drain 18d when the DG FET is turned on by the applied read voltage "Vread", wherein the output current "Ioutput" is amplified according to a bias voltage "Vbias" applied to one of the DG-FET source 18s or DG-FET drain 18d. In some embodiments, the output current "Ioutput" can be used as a measure of the photo-electric conversion resulting from light hitting the respective pixel 10p.

Conventionally, the terminal through which the electrons enter the channel is designated 'source' and the terminal through which the electrons leave the channel is designated 'drain'. In a preferred embodiment, as shown the bias voltage "Vbias" is applied to the DG-FET drain 18d, and the output current "Ioutput" is measured at the DG-FET source 18s. Alternatively, the bias voltage "Vbias" may be applied to the DG-FET source 18s and the output current "Ioutput" is measured at the DG-FET drain 18d.

The gain, that is a change of the drain current with respect to the charge, accumulated on a top gate can be calculated as follows. The drain current of a FET, when it is biased in a saturation regime, may be defined as $$I_D = \mu C_{BG} \frac{W}{L}(V_{BG} - V_T)^2$$

where μ is the filed-effect mobility of the charge carriers, $C_{BG}$ is the capacitance of the gate dielectric per unit area, W and L is the channel width and length, $V_{BG}$ is the voltage, applied to the gate terminal and $V_T$ is the threshold voltage. When the top gate is coupled capacitively to the channel, the charge ΔQ, accumulated on it, effectively changes the threshold voltage of the FET that results in the following change of the drain current:

$$I_D = \mu C_{BG} \frac{W}{L}\left(V_{BG} - V_T + \frac{\Delta Q}{C_{TG}W(L + L_{OV})}\right)^2$$

where $C_{TG}$ is the capacitance of the top gate dielectric per unit area and $L_{OV}$ is the total overlap length between the top gate and source and drain contacts. Therefore, in the saturation mode, the gain is $$G_{sat} = \frac{dI_D}{d\Delta Q} = \mu \frac{2C_{BG}}{C_{TG}L(L + L_{OV})}\left(V_{BG} - V_T + \frac{\Delta Q}{C_{TG}W(L + L_{OV})}\right)$$

When the FET is biased in the linear mode, the drain current is defined as $$I_D = \mu C_{BG} \frac{W}{L}(V_{BG} - V_T)V_D$$

Where $V_D$ is the voltage, applied to the drain electrode. The gain in the linear mode is proportional to the drain voltage and is $$G_{lin} = \mu \frac{C_{BG}}{C_{TG}L(L + L_{OV})}V_{DS}$$

Therefore, DG-FET can be used as an in-pixel amplifier, combining the 'read' FET function and amplification function in conventional, 3 FET pixel architecture, therefore eliminating 1 FET from the pixel layout. Additionally, low voltage performance of CQDs photodiodes may allow 1-DGFET-based pixel architecture, by using the forward bias on a photodiode to for the reset. The materials, used in the preferred embodiment, are thin-film and/or solution-processed semiconductors, allowing multilayer pixel structure. Accordingly, several pixel architectures are proposed that can be used for the imaging device, based on double gate FETs. Double gate FET combine the amplification of the photogenerated charge function and read-out switch. The reset function can be implemented using an additional FET or by applying forward bias to the photodetector.

In some embodiments, each pixel 10p comprises an additional transistor, e.g. single gate FET coupled to the first DG-FET gate 18t, e.g. the top gate connected to the bottom electrode 13b. For example, this can be used to set a reference voltage "Vref" and/or reset the pixel after a read cycle. In a preferred embodiment, each pixel 10p comprises a field effect transistor, FET 19 having a FET source 19s and a FET drain 19d with a FET channel 18c comprising a semiconductor material there between; and a a FET gate 19g adjacent the FET channel 18c. Typically, one of the FET source 19s or FET drain 19d is conductively connected to one of the electrodes 13b of the pixel 10p and the other is used for applying a reference voltage "Vref", wherein the reference voltage "Vref" is applied to the conductively connected electrode 18b when a reset voltage "Vreset" is applied to the FET gate 19g.

In some embodiments, a controller (not shown) is configured to read out a pixel 10p by applying the read voltage "Vread" to the pixel, and measuring the output current "Ioutput". The controller (or a separate voltage source) may also be configured to apply the bias voltage "Vbias". In other or further embodiments, the same or other controller is configured to apply the reset voltage "Vreset" between read cycles of the pixel 10p. The controller (or separate voltage source) may also be configured to apply the reference voltage "Vref". To read out a grid of pixels making up a detector surface of the sensor 100, the pixels can be read out consecutively or simultaneously by one or more controllers. Some or all aspects as described herein can also implemented in further hardware circuits and/or software, e.g. stored on a (non-transitory) computer readable medium with software instructions, which when carried out by the controller or a general purpose processor causes execution of the methods described herein, e.g. readout of pixels in an imaging device.

Figure 3A:
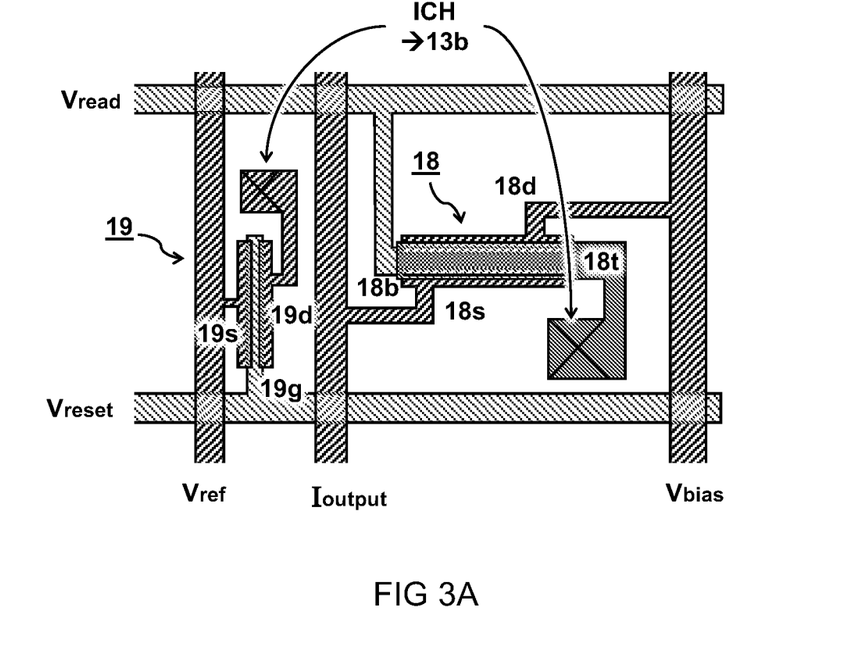
FIGS. 3A and 3B illustrate a top-view of a possible circuit layout forming a pixel similar to the embodiment of FIGS. 2A and 2B.
Figure 3B:
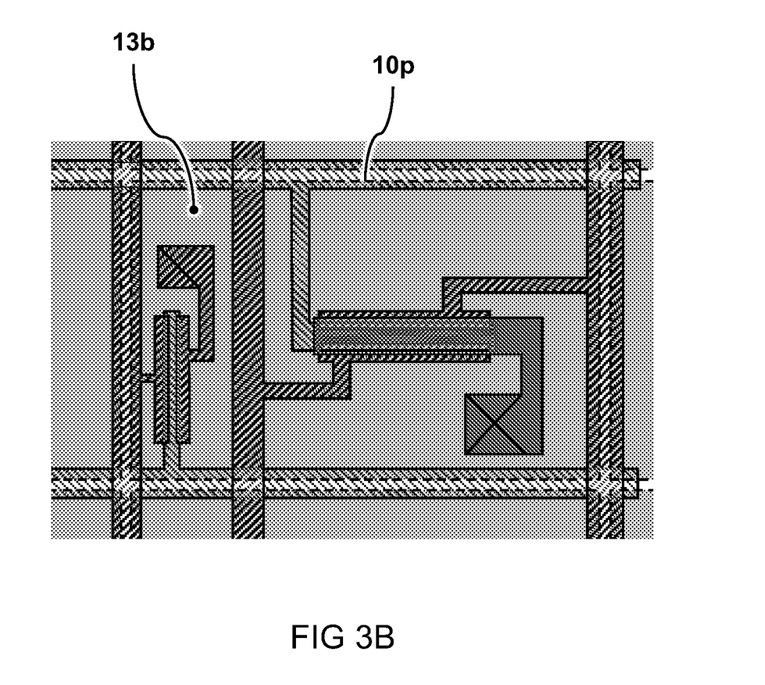

FIGS. 3A and 3B illustrate a top-view of a possible circuit layout forming a pixel 10p e.g. similar to the embodiment of FIGS. 2A and 2B. Electrodes lying in the same plane are indicated by the same shading according to this example. Of course, the size and geometry of the transistors can vary, e.g. they can also be made in interdigitated configuration. FIG. 3B particularly illustrates the patterning of the bottom electrode 13b with gray dashed areas, also shown on top of the neighboring pixels. For example, these may be fabricated on top of the read-out part or connected using solder bump bonding. In some embodiments, the DG-FET top gate 18t and the FET drain 19d are conductively connected via a bottom electrode 13b of a respective pixel. Typically, as shown, the bottom electrodes 13b is divided e.g. by non-conductive material, to define a grid of pixels 10p. In the embodiment shown, the DG-FET top gate 18t and the FET drain 19d are connected via interconnect holes (ICH) to the bottom electrode 13b. Of course also other part than shown could be connected to form equivalent structures.

Figure 4A:
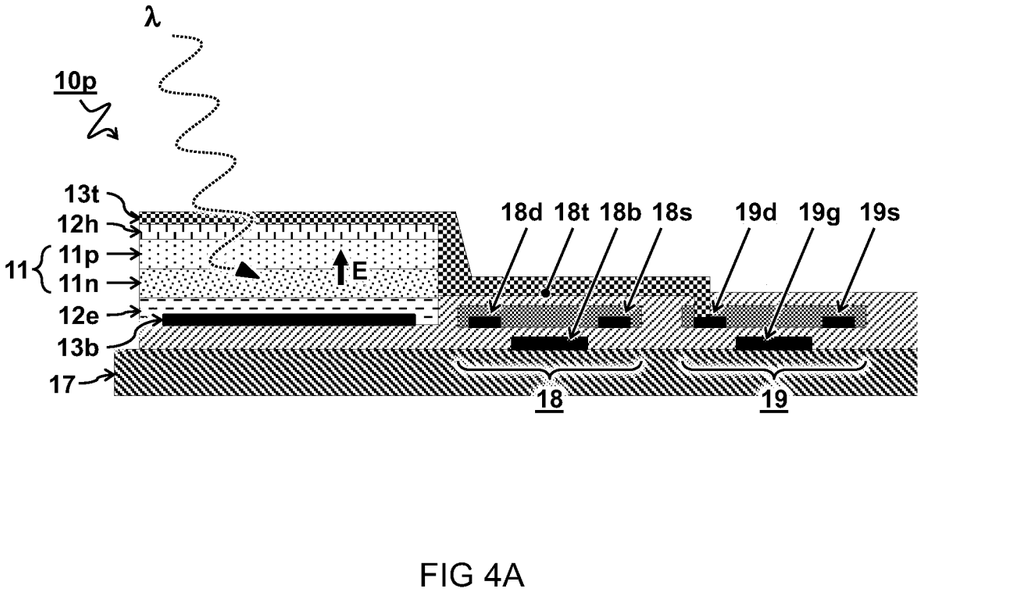
FIGS. 4A and 4B illustrate a cross-section view and corresponding circuit diagram of a pixel according to a reversed layout.
Figure 4B:
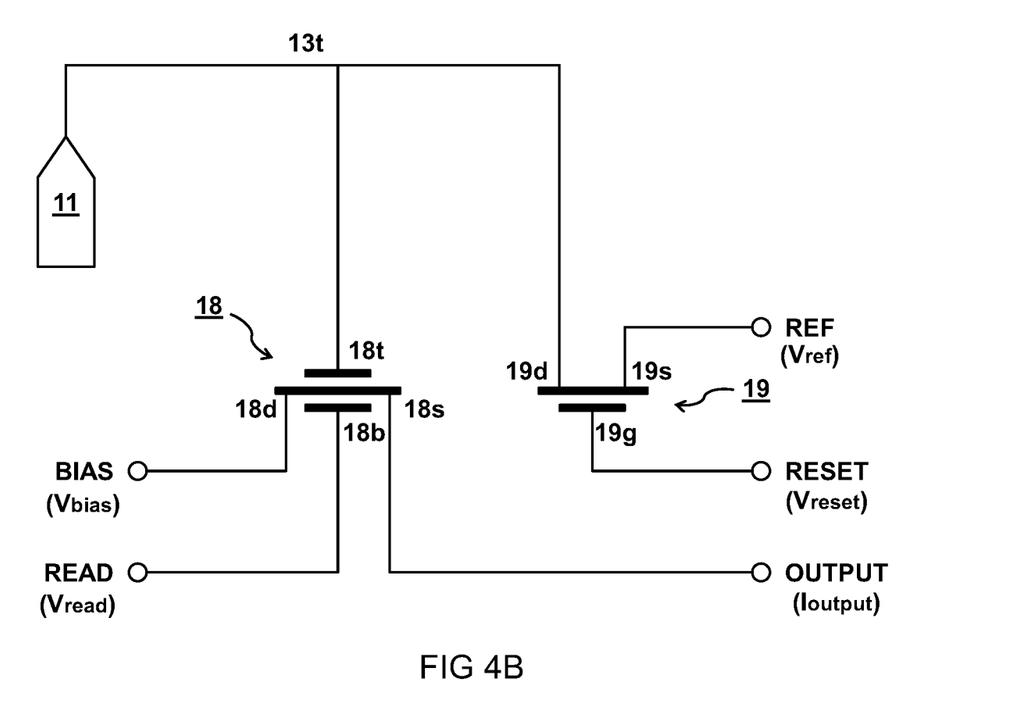

FIGS. 4A and 4B illustrate a cross-section view and corresponding circuit diagram of a pixel 10p according to an alternative, e.g. single layer layout. In the embodiment shown, the p-type photoactive layer 11p is arranged on top, and the n-type photoactive layer 11n is on the bottom. The optional hole transport layer 12h and electron transport layer 12e are also reversed. For example, the embodiment illustrates that the DG-FET top gate 18t and FET drain 19d can also be conductively connected to the top electrode 13t instead of the bottom electrode. In the embodiment shown, the top electrode 13t is connected to the first DG-FET gate 18t which is preferably the top gate, i.e. gate at the same side as receiving the light. In one embodiment, an n-type semiconducting material such as InGaZnO is used as a semiconductor for the DG FET 18 and FET 19. In another or further embodiment, the same material is used for the electron transport layer 12e.

Aspects as described herein can also be embodied by a method of manufacturing an imaging device 100, as described e.g. with reference to any of FIGS. 1A-1C, 2A, 4A, or otherwise. In some embodiments, the method comprises providing a substrate 17 with readout electronics comprising a bottom electrode 13b. In other or further embodiments, the method comprises depositing a stack of photoactive layers 11 onto the substrate. In another or further embodiment, the method comprises depositing a top electrode 13t. Accordingly, the bottom and top electrodes 13t, 13b sandwich the photoactive layers 11. As described earlier, at least one of the electrodes 13b is preferably divided in respective pixels 10p for collecting photo-generated charges from respective parts of the photoactive layers 11.

In a preferred embodiment, the photoactive layers are deposited by applying respective solutions comprising colloidal quantum dots. For example, a layer is deposited comprising a solvent with colloidal quantum dots, wherein the solvent is removed, e.g. evaporated, after deposition. Most preferably, each (type of) photoactive layer is deposited by a single fluid processing step. For example, QD layers are formed by spin coating, blade coating, spraying or other technique. In a preferred embodiment, the ligand exchange is made in solution resulting in different CQDs inks. Alternatively, or additionally, ligand exchange can be performed in the film after deposition. In some embodiments, the photoactive layers may be continuous. In other embodiments, the photoactive layers may be patterned, e.g. according to the pixel pattern of the readout electronics.

A detailed example of a possible manufacturing method will now be described with reference to FIGS. 5A-5P. Of course many variations can be envisaged with similar result having the benefit of the present teachings.

Figure 5A:
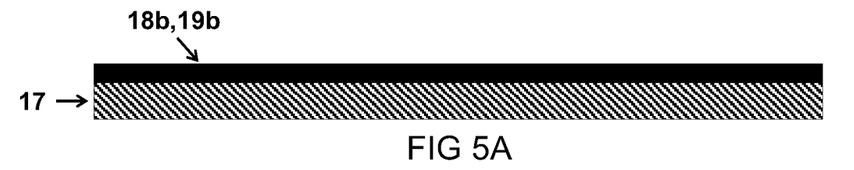
FIGS. 5A-5P illustrate steps in manufacturing an imaging device.

FIG. 5A illustrates a metal layer being deposited on a substrate 17.

Figure 5B:
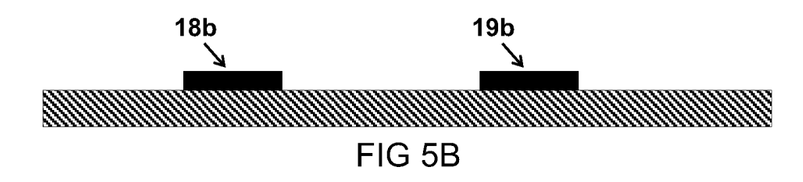

FIG. 5B illustrates the metal layer being patterned, e.g. using wet etching or any other process, to form gate contacts 18b, 19b for the DG FETs and FETs.

Figure 5C:
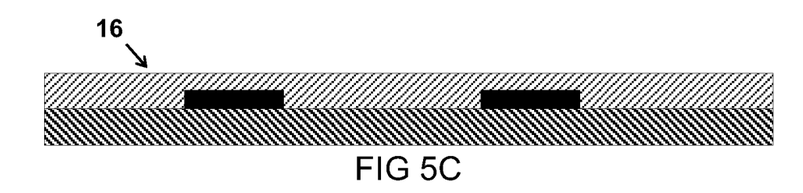

FIG. 5C illustrates a bottom gate insulator For example, Al2O3 or HfO or other being deposited e.g. using atomic layer deposition ALD or any other process.

Figure 5D:
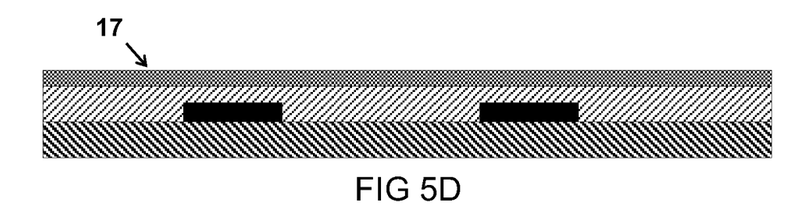

FIG. 5D illustrates semiconductor, for example ZnO. InGaZnO, InO, carbon nanotubes, organics or any other channel material for FETs and DG FETs, being deposited using ALD, sputtering, spin coating, spray coating or any other process.

Figure 5E:
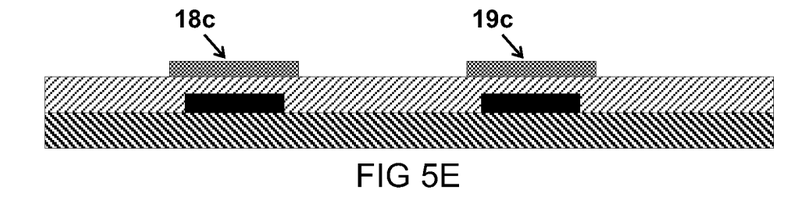

FIG. 5E illustrates the semiconductor being patterned to form FET/channels 18c, 19c, e.g. using wet/dry etching or any other process.

Figure 5F:
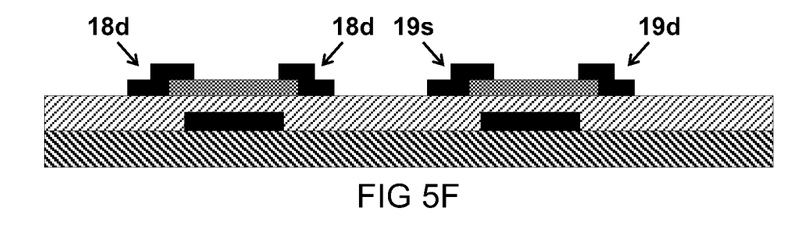

FIG. 5F illustrates source 18s, 19s, and drain 18d, 19d top contacts being formed, e.g. using lift-off or any other process.

Figure 5G:
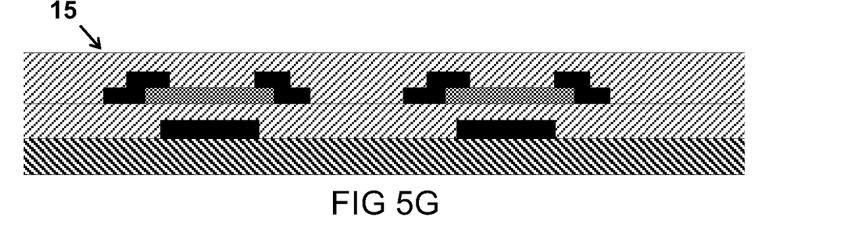

FIG. 5G illustrates top gate dielectric layer 14, e.g. Al2O3 or HfO or other, being deposited, e.g. using ALD or any other process. The dielectric layer may also serve as an encapsulation/passivation layer for the semiconductor.

Figure 5H:
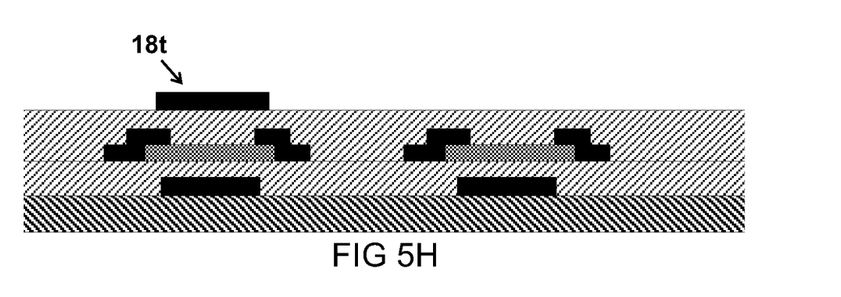

FIG. 5H illustrates top gate metal contact 18t being formed, e.g. by lift-off or wet etching or any other process.

Figure 5I:
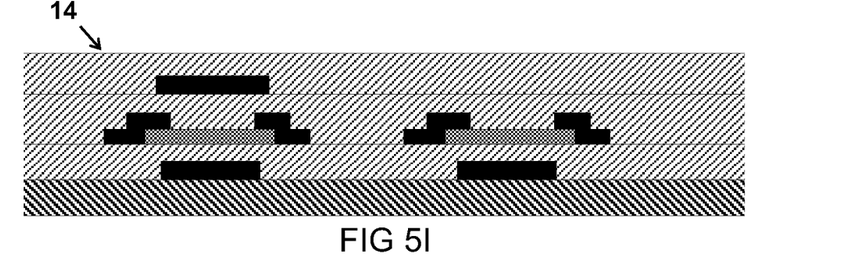

FIG. 5I illustrates an additional encapsulation layer 14 for example, epoxy based photoresist SU-8 or other being deposited optionally.

Figure 5J:
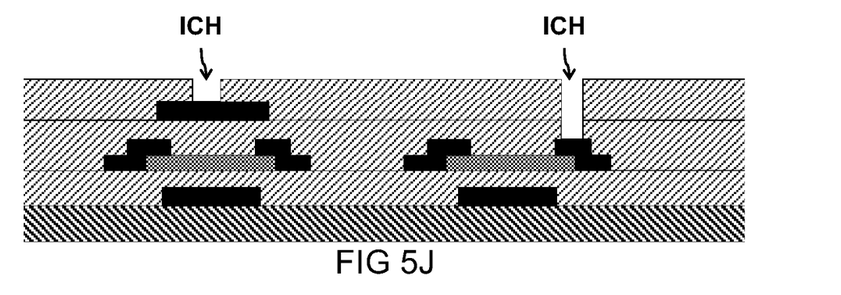

FIG. 5J illustrates fabrication of interconnection holes (ICH). For example, when using SU-8, the holes in the encapsulation layer 14 can be made e.g. lithographically, and the dielectric layer 14 can be wet etched further.

Figure 5K:
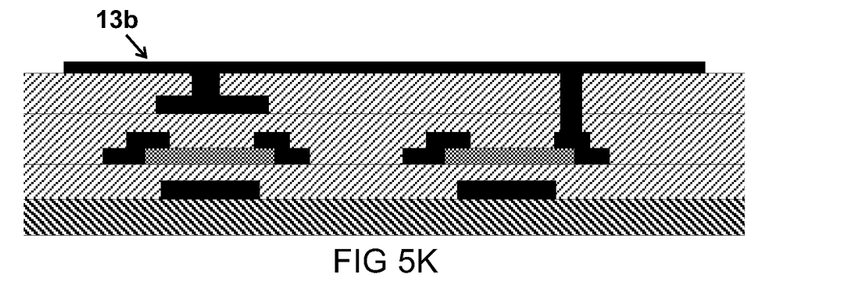

FIG. 5K illustrates a metal layer is deposited and patterned as a bottom electrode 13b of the photodetector, covering the pixel area. With this step, fabrication of the read-out part may be finished.

Figure 5L:
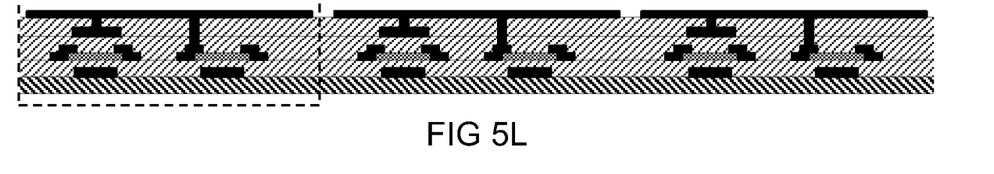

FIG. 5L illustrates a repeated pattern where the dashed region corresponds to the read-out part of a pixel as shown in FIG. 5K.

Figure 5M:
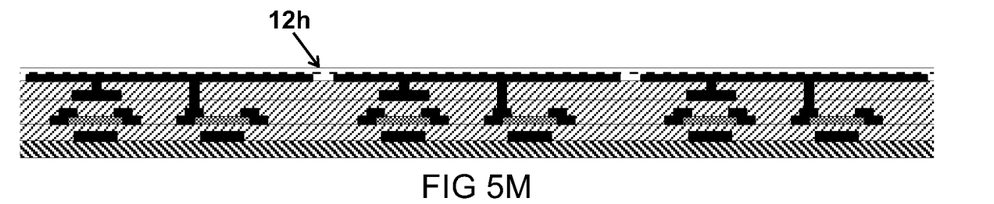

FIG. 5M illustrates an optional hole transport layer 12h, e.g. comprising NiO, being deposited over the bottom electrodes. For example, the layer is fabricated by sputtering or other process.

Figure 5N:
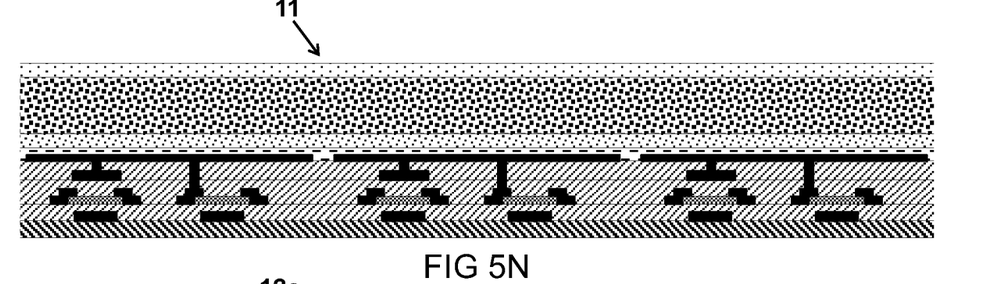

FIG. 5N illustrates the stack of photoactive layers 11 being deposited. While a single photoactive layer can in principle be used to manufacture an imaging device with pixels as described herein, preferably at least two, more preferably at least three different photoactive layers are used. Most preferably, an i-type photoactive layer is sandwiched by an n-type and a p-type photoactive layer.

Figure 5O:
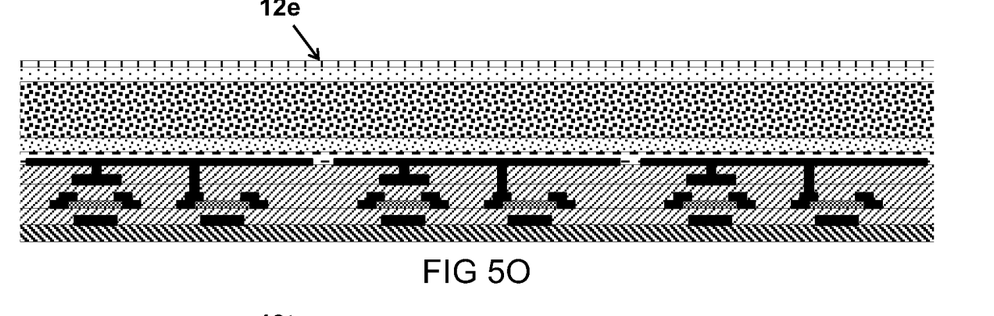

FIG. 5O illustrates an optional electron transport layer 12e being fabricated, e.g. ALD-grown ZnO or TiO.

Figure 5P:
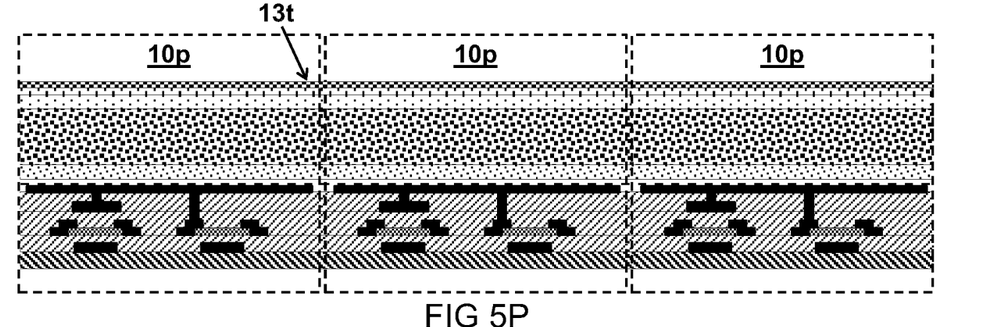

FIG. 5P illustrates a (transparent) top electrode 13t being fabricated on top of the stack, e.g. comprising ITO or Al-doped ZnO.

It will be noted that not all layers or structures as described in the embodiment of FIGS. 5A-5P may be needed to form desired structures as described herein. For example, some layers such as the electron/hole transport layers can be omitted, or replaced by hole/electron blocking layers, respectively. Alternatively, or in addition, also further layers can be added, e.g. an oscillation or scintillating layer (not shown), to convert X-rays into the visible light for radiation imaging. Additionally, or alternatively, direct X-ray conversion is possible if QDs layer are thick enough. Deposition of one or more layers and structures can also be combined or broken up into one or more equivalent steps. For example, a thick layer of quantum dots may also be fabricated by repeated steps of applying thinner layers. For example, various gates and other contacts may also be provided in other layers than shown.

It is observed that conventional CQDs may exhibit stability problems and degradation after lithographical procedures. To improve these and other aspects, a lithography routine may be provided to pattern CQDs film and to deposit patterned contacts on top of the CQDs film as follows.

In some embodiments, special surface treatment of the substrate can be used to prevent delamination and cracking of the film during lithography. In other or further embodiments, the use of adhesion promoters (such as "Ti Prime") or self-assembled monolayers (APTES, HMDS or others) modifies the surface energy and favors the adhesion of CQDs. In some embodiments, CQDs film can be etched using standard photoresists and etching processes, i.e. wet etching using HCl, dry etching using argon plasma or others. A preferred way to implement resist removal is sonicate the device in acetone/isopropanol, since CQDs film is not soluble in those solvents and is not damaged during the process.

In some embodiments, patterning photoresist for the lift-off deposition of top electrodes may involve exposure of the CQDs to the developer, normally based on 2.38% water solution of tetramethylammonium hydroxide (TMAOH). TMAOH is a strong alkali, able to substitute ligands in CQDs film by OH groups, creating p-type layer close to the surface of CQDs film. Therefore, in a preferred configuration of the photodiode, by choosing OH— ligands for p-type layer, deposited on top of an n-type layer (or i-type), it is possible to avoid the undesired effect of the developer, since the top layer of CQDs film already contains OH— capped CQDs. For other ligands, and for inverted device configuration, it is preferred to avoid exposure of the film to alkaline-based developers. Accordingly, in such embodiments, the electrodes may be patterned using orthogonal photolithography, e.g. based on fluorinated photoresists.

In some embodiments, when the device is complete, a mild thermal annealing (110°-130° C.) can be used to restore charge transport through CQDs film. The annealing may lead to increase of the electronic coupling between quantum dots and decrease of the concentration of the trap states.

Various results will now be briefly discussed to illustrate features and advantages of embodiments as described herein.

Figure 6:
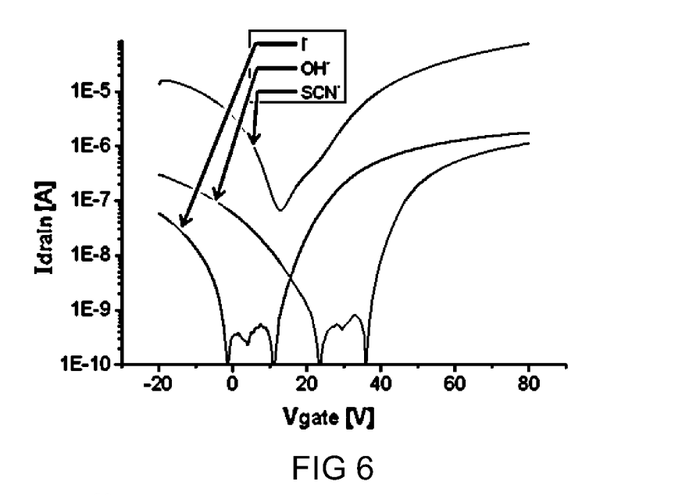
FIGS. 6-12 illustrate various graphs with measurements according to some embodiments.

FIG. 6 illustrates measurement of the drain current "Idrain" as a function of the gate voltage "Vgate" for three different example of FETs, made from n-type CQDs film (I— ligands), p-type CQDs film (OH— ligands) and ambipolar CQDs film (SCN— ligands).

Figure 7:
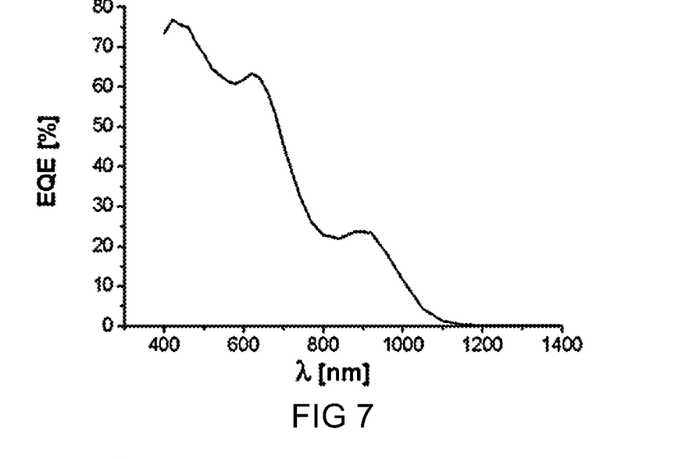

FIG. 7 illustrates an example of external quantum efficiency (EQE) of photon-to-current conversion of a CQDs p-n junction photodetector.

Figure 8:
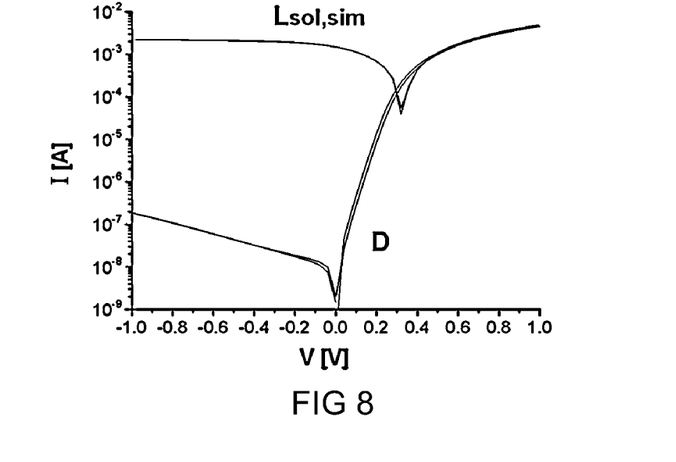

FIG. 8 illustrates an example of a current-voltage curve of a CQDs p-n junction photodetector in dark (D) and under AM1.5 solar light (Lsol,sim) illumination.

Figure 9:
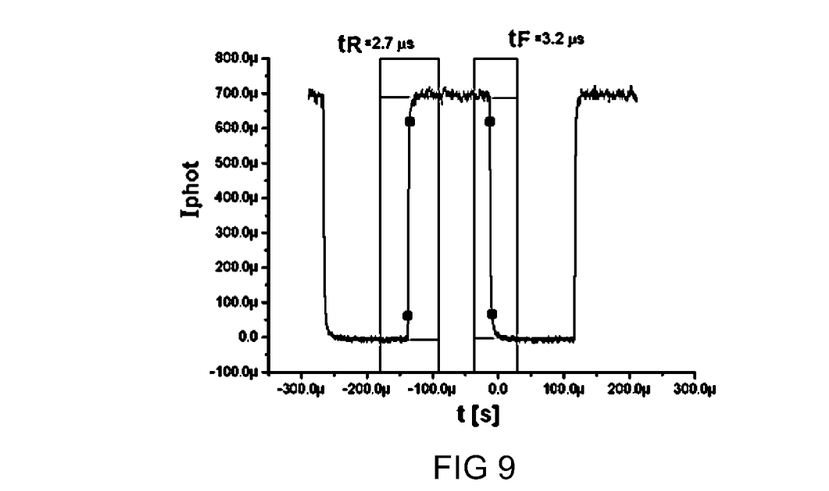

FIG. 9 illustrates a photoresponse of a CQDs p-n junction photodiode with 9 mm2 area to 800 nm laser light, modulated by mechanical chopper.

Figure 10:
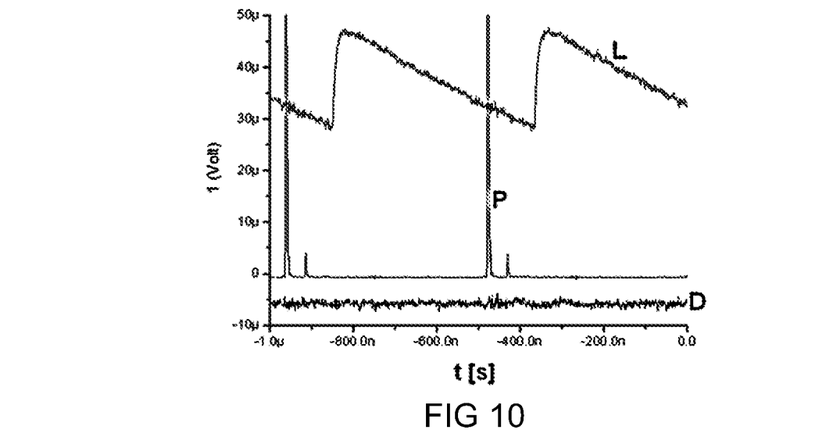

FIG. 10 illustrating a photoresponse to pulsed laser light P, where "L" is light and "D" is dark.

Figure 11:
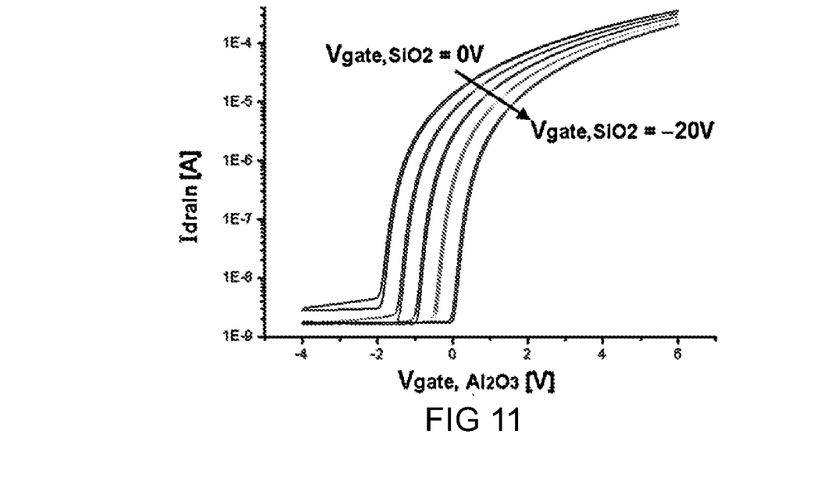

FIG. 11 illustrates transfer curves of InGaZnO thin film double gate FET, illustrating the threshold voltage shift by applying a voltage bias to the bottom gate. The curves are measured by sweeping the voltage at the top gate (Al2O3 gate dielectric) and applying bias voltage (0V, 5V, 10V, 15V and 20V) to the bottom gate (SiO2).

Figure 12A:
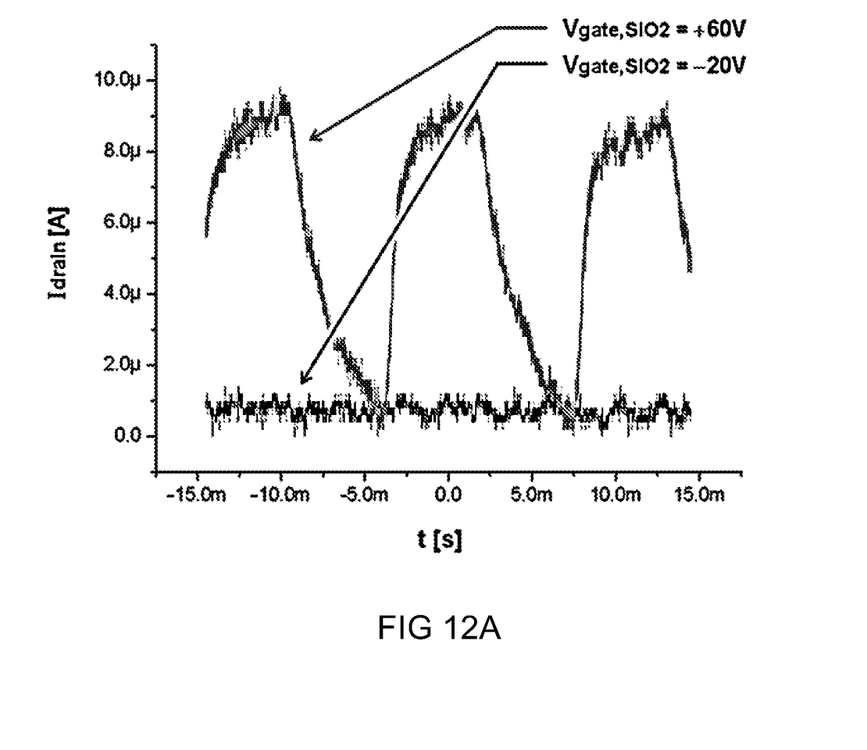
Figure 12B:
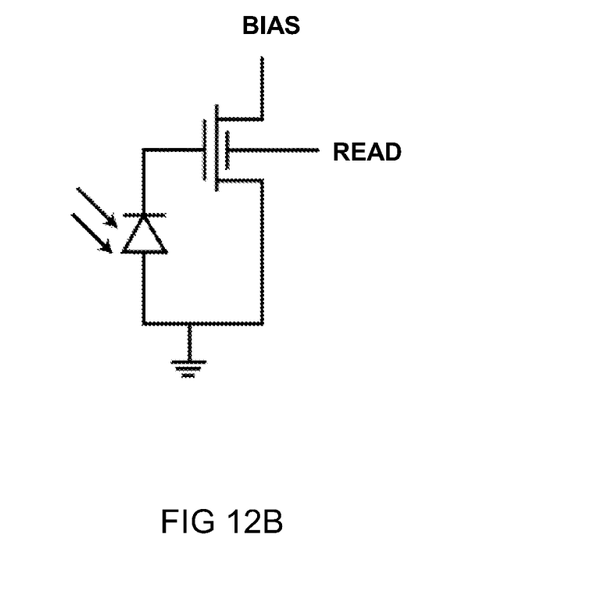

FIG. 12A illustrates the drain current response of a DG FET with an unbiased CQDs p-n junction photodiode, connected to the top gate as it is shown on the schematics in FIG. 12B. The charges on the top gate are generated as a photoresponse to chopper-modulated 800 nm laser light. The drain current is plotted when the transistor is in the off state (negative bias −20 V on the bottom gate) and in the on state (positive bias +60 V on the bottom gate).

For the purpose of clarity and a concise description, features are described herein as part of the same or separate embodiments, however, it will be appreciated that the scope of the invention may include embodiments having combinations of all or some of the features described. For example, while embodiments were shown for photo-active layers including three different types of QD films, also alternative ways may be envisaged by those skilled in the art having the benefit of the present disclosure for achieving a similar function and result. E.g. photoactive or electric components or layers may be combined or split up into one or more alternative components. The various elements of the embodiments as discussed and shown offer certain advantages, such as image detection in various wavelength ranges. Of course, it is to be appreciated that any one of the above embodiments or processes may be combined with one or more other embodiments or processes to provide even further improvements in finding and matching designs and advantages. It is appreciated that this disclosure offers particular advantages to the manufacture of efficient imaging sensors, and in general can be applied for any application where colloidal quantum dots are used in one, two, three, or more different layers.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. An imaging device comprising:
    a stack of photoactive layers including at least a p-type photoactive layer and an n-type photoactive layer, wherein the photoactive layers comprise quantum dots formed by semiconductor nanocrystals capped by ligands, wherein the photoactive layers are amorphous, comprising a discorded structure of quantum dots resulting from deposition by applying respective solutions comprising colloidal quantum dots; and
    readout electronics comprising electrodes sandwiching the photoactive layers, wherein at least one of the electrodes is divided in respective pixels for collecting photo-generated charges from respective parts of the photoactive layers, wherein each pixel comprises an amplification circuit to amplify the photo-generated charge.

2. The imaging device according to claim 1, wherein the quantum dots are essentially separated by the ligands.

3. The imaging device according to claim 1, wherein the semiconductor nanocrystals are capped by respective types of ligands, wherein a respective type of the photoactive layer is determined by a respective type of the ligands.

4. The imaging device according to claim 1, wherein a respective type of the photoactive layer is at least partially determined by inorganic dopants added to the layer.

5. The imaging device according to claim 1, wherein the stack of photoactive layers comprises at least three different types of photoactive layers including an intermediate photoactive layer between the p-type photoactive layer and the n-type photoactive layer, and wherein the intermediate photoactive layer comprises relatively large quantum dots compared to quantum dots in the p-type photoactive layer and the n-type photoactive layer.

6. The imaging device according to claim 1, wherein the quantum dots in different types of photoactive layers are capped with a respective different type of ligand.

7. The imaging device according to claim 1, wherein a scintillating layer is provided between the stack of photoactive layers and a front side of the device receiving light.

8. An imaging device comprising;
a stack of photoactive layers comprising at least three different types of photoactive layers including a p-type photoactive layer, an n-type photoactive layer, and an intermediate photoactive layer between the p-type photoactive layer and the n-type photoactive layer, wherein the photoactive layers comprise quantum dots formed by semiconductor nanocrystals capped by ligands, wherein the intermediate photoactive layer comprise relatively large quantum dots compared to quantum dots in the p-type photoactive later and the n-type photoactive layer, and
readout electronics comprising electrode sandwiching the photoactive layers, wherein at least one of the electrodes is divided in respective pixels for collecting photo-generated charges from respective parts of the photoactive layers, wherein each pixel comprises an amplification circuit to amplify the photo-generated charge.

9. The imaging device according to claim 8, wherein the photoactive layers are amorphous, comprising a disordered structure of quantum dots resulting from deposition by applying respective solutions comprising colloidal quantum dots.

10. The imaging device according to claim 8, wherein the intermediate photoactive layer is formed by an ambipolar quantum dot layer.

11. The imaging device according to claim 8, wherein the intermediate photoactive layer has a layer thickness larger than the layer thicknesses of both the p-type photoactive layer and the n-type photoactive layer by at least a factor five.

12. The imaging device according to claim 11, wherein the intermediate layer thickness is between ten and hundred micrometer.

13. An imaging device comprising;
a stack of photoactive layers including at least a p-type photoactive layer and an n-type photoactive layer, wherein the photoactive layers comprise quantum dots formed by semiconductor nanocrystals capped by ligands; and
readout electronics comprising electrodes sandwiching the photoactive layers, wherein at least one of the electrodes is divided in respective pixels for collecting photo-generated charges from respective parts of the photoactive layers, wherein each pixel comprises an amplification circuit to amplify the photo-generated charge,
wherein each pixel comprises a double gate field effect transistor, DG-FET, having
a DG-FET source and a DG-FET drain with a DG-FET channel comprising a semiconductor material there between;
a first DG-FET gate adjacent one side of the DG-FET channel and conductively connected to one of the electrodes of the pixel; and
a second DG-FET gate adjacent another side of the DG-FET channel for applying a read voltage to the pixel;
wherein the DG-FET is configured to have the first DG-FET gate accumulate charges during an integration cycle of the pixel, generated by photo-electric conversion in the stack of photoactive layers adjacent the conductively connected electrode, wherein the accumulated charges create a shift of a threshold voltage of the DG FET, and change an output current through the DG-FET channel between when the DG-FET source and the DG-FET drain when the DG FET is turned on by the applied read voltage, wherein the output current is amplified according a bias voltage applied to one of the DG-FET source or DG-FET drain, wherein the output current is a measure of the photo-electric conversion resulting from light hitting the pixel.

14. The imaging device according to claim 13, wherein each pixel comprises a field effect transistor, FET, having:
a FET source and a FET drain comprising a semiconductor material there between; and a
a FET gate adjacent the FET channel;
wherein one of the FET source or FET drain is conductively connected to one of the electrodes of the pixel and the other is used for applying a reference voltage, wherein the reference voltage is applied to the conductively connected electrode when a reset voltage is applied to the FET gate.

15. The imaging device according to claim 14, wherein the DG-FET top gate and the FET drain are conductively connected via a bottom electrode of a respective pixel.

16. The imaging device according to claim 15, comprising a controller configured to read out a pixel by applying the read voltage to the first DG-FET gate and measure the output current, and wherein the controller is configured to apply the reset voltage between read cycles of the pixel.

17. A method of manufacturing the imaging device of claim 1, the method comprising:
providing a substrate with readout electronics comprising a bottom electrode;
depositing a stack of photoactive layers onto the substrate including at least a p-type photoactive layer and an n-type photoactive layer, wherein the photoactive layers comprise quantum dots formed by semiconductor nanocrystals capped by ligands, wherein the photoactive layers are deposited by applying respective solutions comprising colloidal quantum dots; and
depositing a top electrode such that the bottom and top electrodes sandwich the photoactive layers, wherein at least one of the electrodes is divided in respective pixels for collecting photo-generated charges from respective parts of the photoactive layers, wherein each pixel comprises an amplification circuit to amplify the photo-generated charge.

18. The method according to claim 17, wherein each type of photoactive layer is deposited by a single fluid processing step.

19. The method according to claim 17, wherein prior to the deposition of the photoactive layers onto a surface of the readout electronics, the surface is treated by adhesion promoters or self-assembled monolayers modifying the surface energy and favoring adhesion of the CQDs.

20. The method according to claim 19, wherein the photoactive with layers CQDs are etched using photoresist and etching, wherein the photoresist is removed by sonicating the layers submerged in a solvent in which the CQDs are not soluble.

* * * * *